(12) United States Patent
Ge

(10) Patent No.: US 10,847,219 B2
(45) Date of Patent: Nov. 24, 2020

(54) ROW SWITCH RESISTANCE ERROR REDUCTION FOR RRAM CROSSBAR ARRAY CIRCUIT

(71) Applicant: TETRAMEM INC., Newark, CA (US)

(72) Inventor: Ning Ge, Newark, CA (US)

(*) Notice: Subject to any disclaimer, the term of this patent is extended or adjusted under 35 U.S.C. 154(b) by 0 days.

(21) Appl. No.: 16/255,682

(22) Filed: Jan. 23, 2019

(65) Prior Publication Data
US 2020/0234763 A1    Jul. 23, 2020

(51) Int. Cl.
  *G11C 13/00* (2006.01)
  *H03F 3/45* (2006.01)
(52) U.S. Cl.
  CPC .......... *G11C 13/0028* (2013.01); *H03F 3/45* (2013.01); *H03F 2203/45206* (2013.01)
(58) Field of Classification Search
  CPC .......................... G11C 13/0028; H03F 3/45
  See application file for complete search history.

(56) References Cited

U.S. PATENT DOCUMENTS

| | | | |
|---|---|---|---|
| 7,755,424 B2 * | 7/2010 | Mouttet | H03G 5/00 330/144 |
| 9,443,610 B1 * | 9/2016 | Pan | G11C 29/025 |
| 9,697,912 B2 * | 7/2017 | Pan | G11C 29/025 |
| 2017/0352412 A1 * | 12/2017 | Harvard | G11C 13/004 |
| 2019/0147329 A1 * | 5/2019 | Hekmatshoartabari | G06N 3/0635 |

* cited by examiner

*Primary Examiner* — Tri M Hoang
(74) *Attorney, Agent, or Firm* — Aptum Law; Zheng "Andy" Liu; Zheng Liu

(57) ABSTRACT

Technologies relating to RRAM-based crossbar array circuits and more specifically to reducing row switch resistance error of in crossbar array circuits are disclosed. An example apparatus includes: a first Op-amp including a first inverting Op-amp input, a first non-inverting Op-amp input, and a first Op-amp output; a row switch device including a row switch input and a row switch output; a crossbar array including a row wire, a column wire, and a cross-point device connected between the row wire and the column wire. The row switch input is connected to the first Op-amp output; the row switch output is connected to the first inverting Op-amp input; and the row switch output is connected to the row wire.

5 Claims, 5 Drawing Sheets

ROW SWITCH RESISTANCE ERROR REDUCTION FOR RRAM CROSSBAR ARRAY CIRCUIT

TECHNICAL FIELD

The present disclosure generally related to RRAM-based crossbar array circuits, and more specifically to reducing row switch resistance error in crossbar array circuits.

BACKGROUND

Crossbar array circuit may be used in non-volatile solid-state memories, signal processing systems, control systems, high-speed image processing systems, and neural networks. A crossbar array circuit may include horizontal metal wire rows and vertical metal wire columns (or other electrodes) intersecting with each other, with crossbar devices formed at the intersecting points.

Crossbar device may include a Resistive Random-Access Memory (RRAM, or so-called memristor). RRAM is a two-terminal passive device that is capable of changing resistance upon sufficient electrical stimulations, which have attracted significant attention for high-performance nonvolatile memory applications. The resistance of the RRAM may be electrically switched between two states: a High-Resistance State (HRS) and a Low-Resistance State (LRS). The switching event from FIRS to LRS is called a "Set" or "On" switching process. Conversely, the switching from LRS to FIRS is called a "Reset" or "Off" switching process.

SUMMARY

The technology disclosed is an RRAM-based crossbar array circuit and more specifically to a crossbar array circuit for reducing row switch resistance error of the crossbar array circuit.

In some implementations, an apparatus includes: a first Operational Amplifier (also referred to as Op-amp) including a first inverting Op-amp input, a first non-inverting Op-amp input, and a first Op-amp output; a row switch device including a row switch input and a row switch output; a crossbar array including a row wire, a column wire, and a cross-point device connected between the row wire and the column wire, wherein the row switch input is connected to the first Op-amp output, the row switch output is connected to the first inverting Op-amp input, and the row switch output is connected to the row wire.

In some implementations, the apparatus further includes: a Digital-to-Analog Converter (DAC) connected to the row switch, wherein the Analog to Digital Converter (DAC) includes the first Op-amp; a column switch device connected to the column wire; a Transimpedance Amplifier (TIA) connected to the column switch device; an ADC connected to the TIA.

In some implementations, the cross-point device may be one of: a memristor, a memristive device, a Pulse-Code Modulation (PCM) device, a floating gate device, a phase change device, a Resistive Random-Access Memory (RRAM or ReRAM), a Magnetoresistive Random-Access Memory (MRAM), a Dynamic random-access memory (DRAM), a Static Random-Access Memory (static RAM or SRAM), or other devices with tunable resistance.

In some implementations, the cross-point device may be 1-Transistor-1-Resistor (1T1R), 1-Selector-1-Resistor (1S1R), or 2-Resistor (2R) structure.

In some implementations, the row switch includes a Complementary Metal-Oxide-Semiconductor (CMOS) switch circuit.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Crossbar array circuits with reduced row switch resistance error term are provided. The technologies described in the present disclosure may provide the following technical advantages:

First, the disclosed technologies enable various designs of a row driver circuit in an RRAM-based crossbar array circuit, which improve Multiplication Product Matrix (MPW) computation in various applications, for example, in Artificial Intelligence (AI) applications, in image recognition applications, in neural network applications, or in signal processing applications. These row driver circuits may provide a higher resolution of RRAM in computing.

Second, in a large-scale RRAM-based crossbar array circuit, the large number of RRAM cells connected on the same row or column requires higher current and thus increases the effective on-resistance of the switch (or voltage drop across the switch). The effective on-resistance of the switch is one of the serious error terms impacting the performance of the RRAM-based crossbar array circuit, especially in resolution and accuracy during every set, reset, or computing operation.

Third, the designs described in the present disclosure would not increase the size of a switch, rather it allows reduction of the size of switch with proposed error cancellation scheme. Increasing the size of a switch would increase in the silicon area, resulting in higher manufacturing cost, requiring higher switch power, and increased parasitic R/C.

Fourth, many crossbar array circuits include a Digital to Analog Converter (DAC), which, in turn, may include an operational amplifier. Alternatively, the DAC may be connected to a crossbar array, via an operational amplifier. An operational amplifier, which may be referred to as an Op-amp, when connected to a suitable feedback network (such as resistor) across the Op-amp from an output terminal back to an inverting input terminal, may both reduce and control the overall closed-loop gain of the Op-amp. This process may be referred to as "negative feedback," which produces a stable Op-amp based system with proper compensation. Negative feedback opposes or subtracts from the input signals, providing advantages in the design and stabilization of control systems. For example, if a system's output changes for any reason (for example, due to noise, distortion, or error voltage), then negative feedback may counter the change, stabilizing the system. Negative feedback also improves system bandwidth and input and output impedances.

Without requiring additional circuit component, therefore, the technologies described in the present disclosure uses negative feedback provided by an Op-amp, which may already be built in a crossbar array circuit as a DAC or a voltage stabilizer, to reduce error term.

Figure 1:
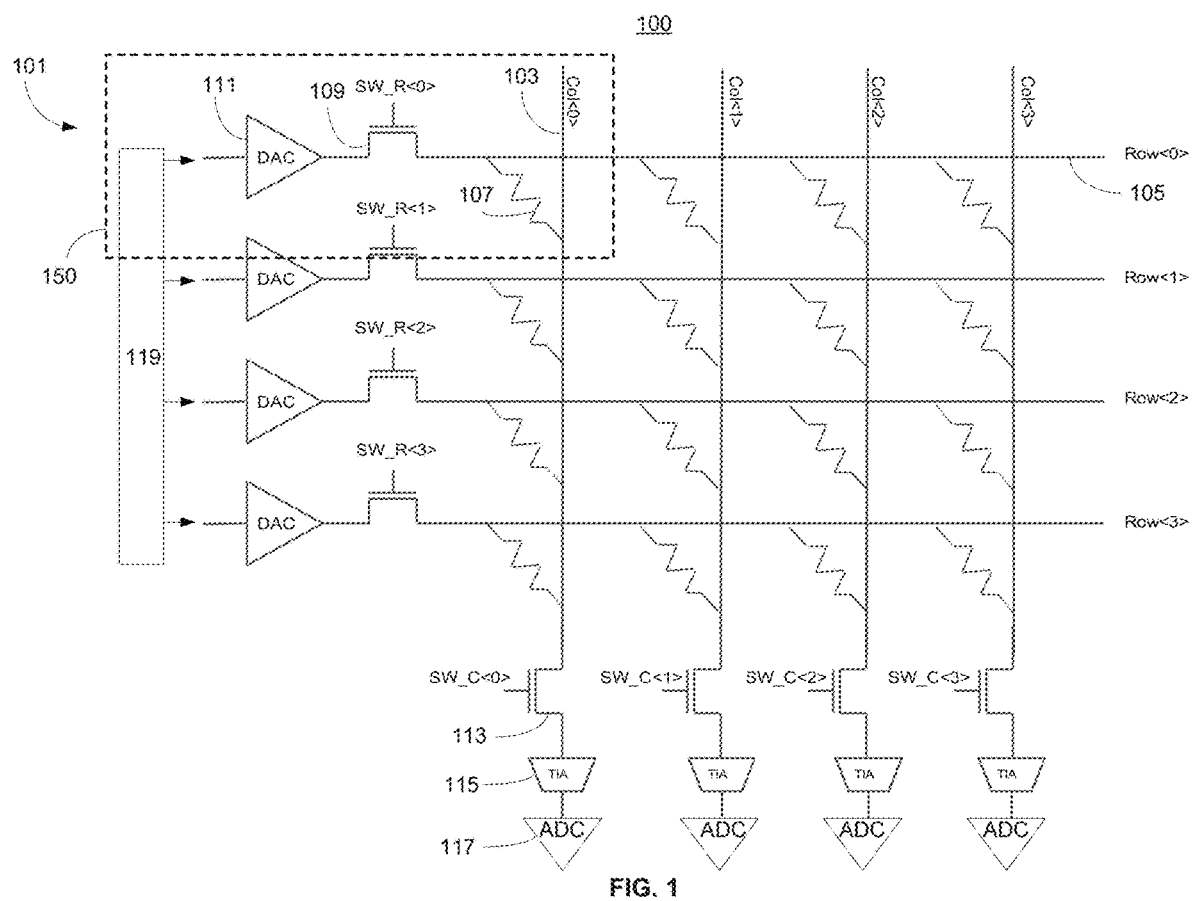
FIG. 1 is a block diagram illustrating an example crossbar circuit in accordance with some implementations of the present disclosure.

FIG. 1 is a block diagram 100 illustrating an example crossbar circuit 101 in accordance with some implementations of the present disclosure. As shown in FIG. 1, the crossbar circuit 101 includes a DAC 111; a row switch 109 connected to the DAC 111; a first row wire 105 connected to the row switch 109; a first column wire 103; a cross-point device 107 connected between the first row wire and the first column wire; a column switch 113 connected to the first column wire 103; a Trans-Impedance Amplifier (TIA) 115 connected to the column switch 113; and an Analog to Digital Converter (ADC) 117 connected to the TIA 115.

The DAC 111, in some implementations, converts a digital signal (for example, an input signal 119) into an analog signal. The DAC 111 may include an Op-amp or may be connected to an Op-amp, both implementations of which are discussed in the present disclosure.

The row switch 109, in some implementations, provides fault protection, ESD protection, and noise reduction. The row switch 109 may include a CMOS switch circuit.

In some implementations, the cross-point device 107 may be one of: a memristor, a memristive device, a Pulse-Code Modulation (PCM) device, a floating gate device, a phase change device, a Resistive Random-Access Memory (RRAM or ReRAM), a Magnetoresistive Random-Access Memory (MRAM), a Dynamic random-access memory (DRAM), a Static Random-Access Memory (static RAM or SRAM), or other devices with tunable resistance. The cross-point device 107 may be 1-Transistor-1-Resistor (1T1R), 1-Selector-1-Resistor (1S1R), or 2-Resistor (2R) structure.

In some implementations, the conductance of the cross-point device 107 is tuned by applying a large enough voltage or current signal across the cross-point device 107.

In some implementations, the row wires (i.e. the first row wire 105), the column wires (i.e. the first column wire 107), or both, are metal wires.

The column switch 113, in some implementations, provides fault protection, ESD protection, and noise reduction. The column switch 113 may include a CMOS switch circuit.

In some implementations, the TIA 115 converts the current signal into the voltage signal; the ADC 117 converts an analog signal into a digital signal; the ADC 117 may include Comparators, Op-amp or may be connected to a comparator, or an Op-amp.

As explained above, when an RRAM-based crossbar circuit is used as the basic cell in MPW in AI core, a higher resolution of RRAM cell is required to provide higher computing performance and maintain lower power consumption. A higher resolution of RRAM cell in computing, however, may require a higher current (with increased current dynamic range). Also, a large number of RRAM cells connected on the same row or column (matrix size) in computing may require a greater conduction current to flow through one or more row switches or column switches. Therefore, an effective on-resistance of the switch (which may also be referred to as a voltage drop across the switch) is one of the serious error terms impacting RRAM resolution in the set, the reset, or the computing operations.

To reduce the effective on-resistance of a switch to be less than ½ LSB of RRAM resolutions, increasing the size of a switch, as a technical solution, may result in several disadvantages.

First, larger silicon area and higher cost are often required. A larger switch size requires a larger silicon area, resulting in higher manufacturing cost.

Second, a higher switching power may be required. A larger switch size requires a higher operating current, which requires a higher switch power.

Third, larger parasitic Resistance/Capacitance (R/C) may be present in the signal path. A larger switch size also leads to a larger parasitic R/C in the signal path, defeating original purpose of increasing a switch size (which is to reduce on-resistance of a switch).

Technologies described in the present disclosure provide a row driver (or a column driver) circuit for RRAM-based crossbar circuit in applications such as AI MPW by reducing or minimizing the effective on-resistance of a switch to meet RRAM resolution/accuracy requirement. These technologies do not increase the size of a switch, reducing adverse effects caused by a larger switch size.

Figure 2:
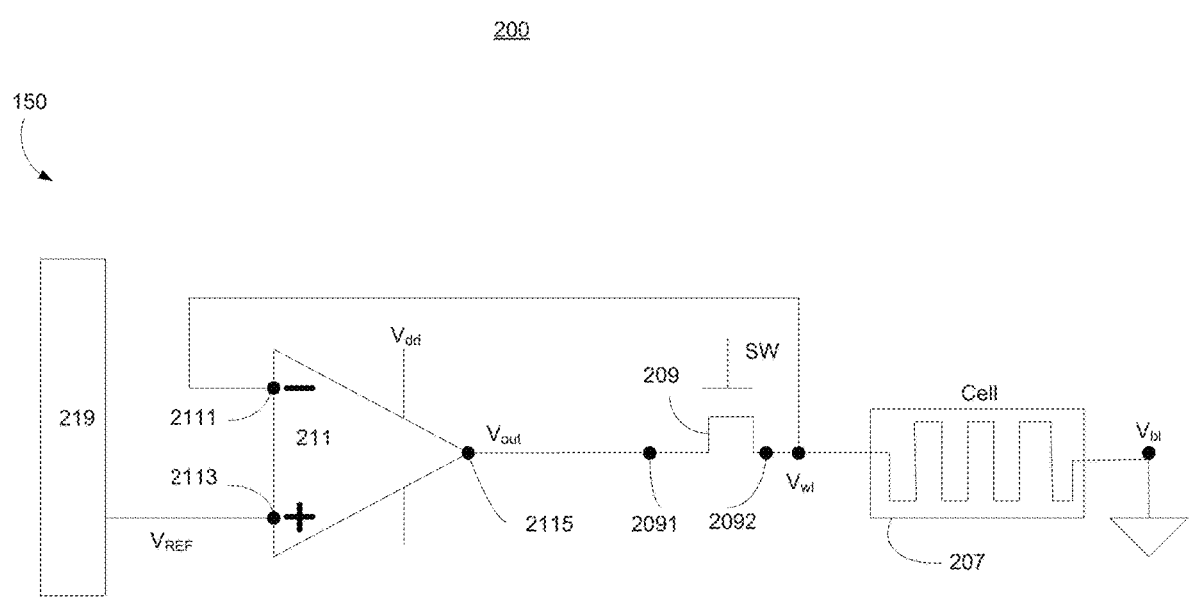
FIG. 2 is a block diagram illustrating a partially enlarged view of an example crossbar circuit in accordance with some implementations of the present disclosure.

FIG. 2 is a block diagram 200 illustrating a partially enlarged view 150 of the crossbar circuit 101 in accordance with some implementations of the present disclosure. As shown in FIG. 2, the portions of the crossbar circuit 101 shown in the partially enlarged view 150 include a first Op-amp 211, which may be connected with a non-inverting input 2113, an inverting input 2111, and an output 2115; a row switch 209, which may be connected with a row switch input 2091, the output 2115, and a row switch output 2092 connected to the inverting input 2111; and an RRAM cell 207, which may be connected with the row switch output 2092.

In some implementations, the DAC 111 shown in FIG. 1 includes the first Op-amp 211 shown in FIG. 2. In some other implementations, the DAC 111 shown in FIG. 1 is connected to the first Op-amp 211 shown in FIG. 2. In still some other implementations, the cross-point device 107 shown in FIG. 1 includes the RRAM cell 207 shown in FIG. 2.

Figure 3:
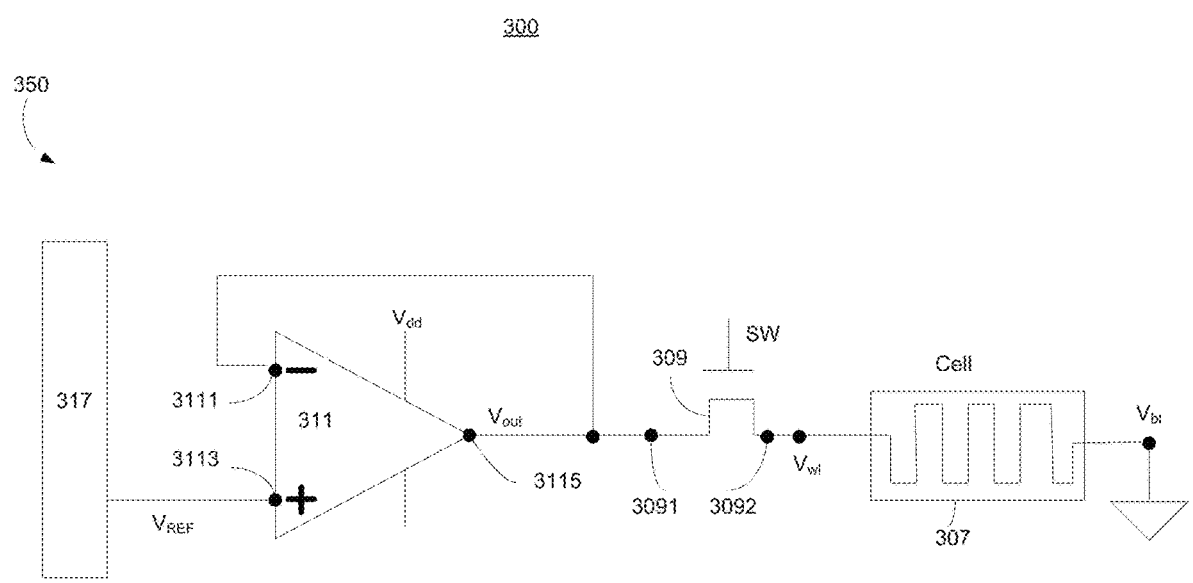
FIG. 3 is a block diagram illustrating a partially enlarged view of an example design crossbar circuit in comparison with the embodiments of the present disclosure.

FIG. 3 is a block diagram 300 illustrating a partially enlarged view 350 of a crossbar circuit in comparison with the embodiments of the present disclosure. The crossbar circuit shown in FIG. 3 may be the circuit 101 shown in FIG. 1.

In some implementations, the crossbar circuit in the partially enlarged view 350 includes a first Op-amp 311, which may be connected to a non-inverting input 3113, an inverting input 3111, and an output 3115; a row switch 309, which may be connected to a row switch input 3091 (which is connected with the output 3115 and the inverting input 3111) and a row switch output 3092; and an RRAM cell 307, which may be connected to the row switch output 3092.

Under ideal operating circumstances, there would be zero resistance for the output port of first Op-amp 311 and for the on-resistance through row switch 309; as a result, Vout would be equal to Vwl, which would, in turn, be equal to, VREF (Vout=Vwl=VREF).

Under real operating circumstances, however, resistance exists in the output port of first Op-amp 311 and in the row switch 309. Especially in a higher current operating environment, such as in a large-scale crossbar circuit, the effect of on-resistance of the switch and Op-amp may be significant.

The present disclosure provides various designs of a circuit, which under real operating circumstances, has a target voltage on Vwl (terminal of RRAM cell) that is the same as (or as close as possible to) VREF (the Reference voltage). The deviation between Vwl and VREF limits the resolution of the RRAM cell, which may be indicated as the error terms. The larger the error term, the smaller the resolution of RRAM. Reducing the error terms would likely produce a higher resolution of RRAM.

FIG. 2 and FIG. 3 illustrate different designs by changing the feedback return (the inverting input 3111, shown in FIG. 3) from the first switch input 3091 (shown in FIG. 3) to the first switch output 3092 (shown in FIG. 2). As explained above, no additional component is required, because by utilizing the negative feedback feature in an Op-amp, which may have already been built into a crossbar array circuit as a DAC or a voltage stabilizer, the error term may be reduced and minimized. Simulations produced by these designs under 1 mA current are shown in FIG. 4 and FIG. 5, respectively.

Figure 4:
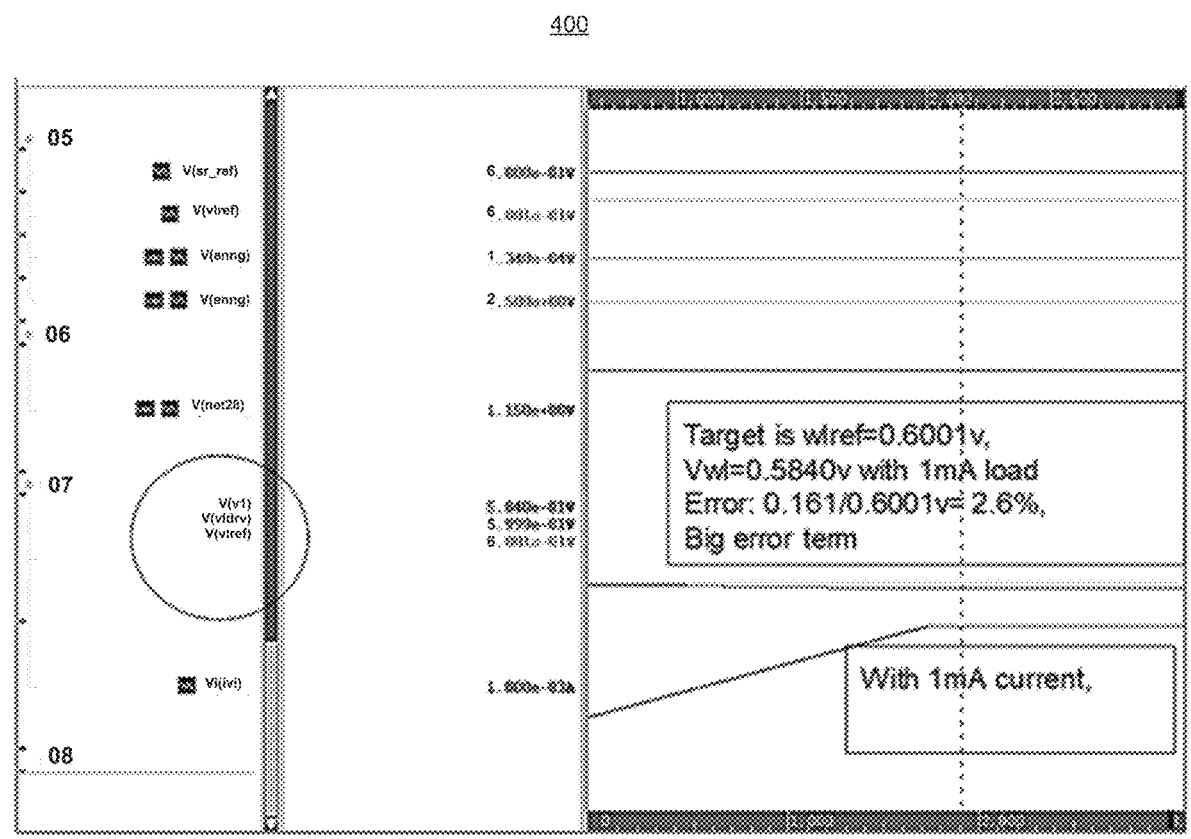
FIG. 4 is a block diagram illustrating simulation results of the normal design shown in FIG. 3.
Figure 5:
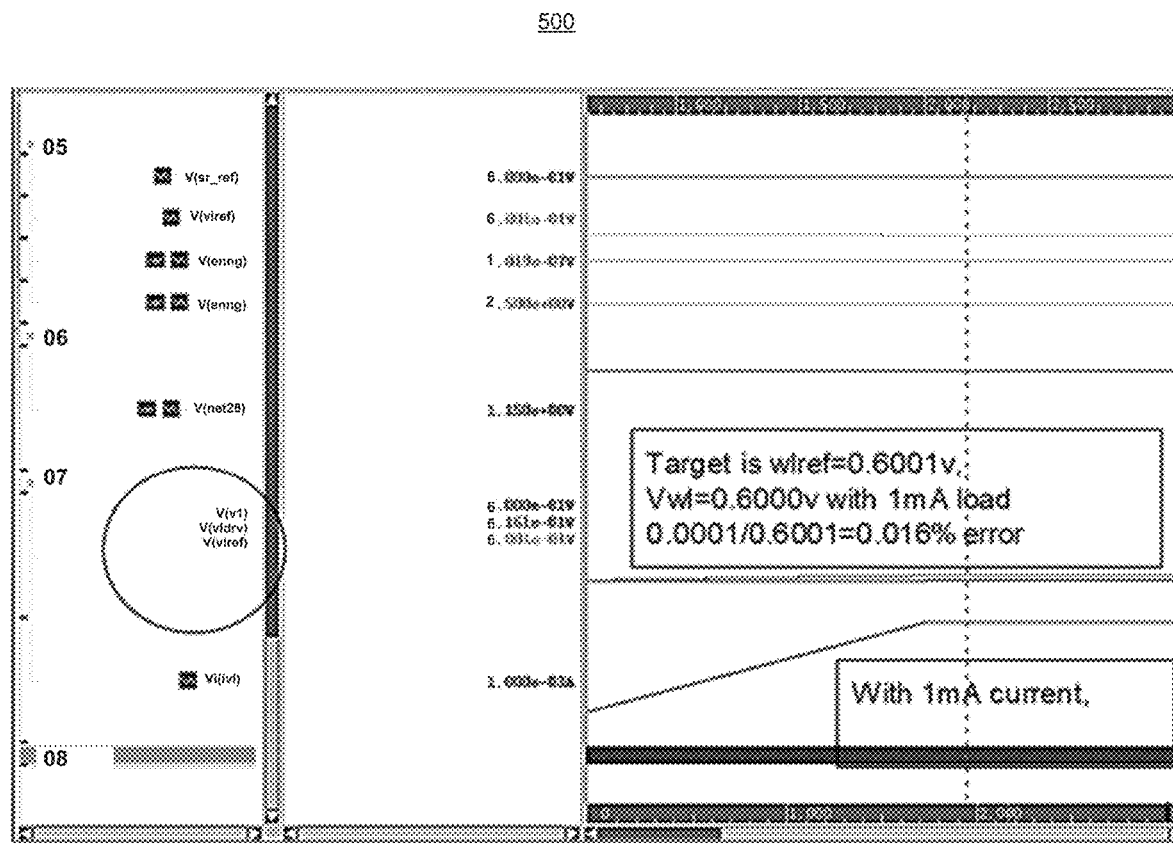
FIG. 5 is a block diagram illustrating simulation results of the implementations in FIGS. 1 and 2.

FIG. 4 shows simulation results 400 produced by the example design shown in FIG. 3 with 1 mA load current to simulate a large load condition. And FIG. 5 shows simulation results 500 produced by designs implementing the negative feedback feature, with 1 mA load current to simulate the large load condition.

Because, the error term=(VREF−Vwl)/VREF, error terms of these different designs may be calculated as follows:

As shown in the simulation results produced by the example design shown in FIG. 3, VREF=0.6001 v, and Vwl=0.5840 v, with 1 mA load. Therefore, the error term is (0.6001-0.5840)/(0.6001)=2.6%. The error term 2.6% may be considered high in many applications.

In contrast, as shown in the simulation results produced by designs implementing the negative feedback feature, VREF=0.6001 v, and Vwl=0.6000 v, with 1 mA load. Therefore, the error term is (0.6001-0.6000)/(0.6001) =0.016%. The error term 0.016% is much lower than that produced by the design shown in FIG. 3.

As can be seen, in designs implementing the negative feedback feature, the error terms due to the existence of switches in a signal path, under high currents, are significantly reduced. With the reduced error terms, the designs implementing the negative feedback feature may effectively increase RRAM resolution, enabling the circuits to be used in applications requiring critical RRAM resolutions, such as AI MPW applications.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation (s).

It will also be understood that, although the terms "first," "second," etc. may be used herein to describe various elements, these elements should not be limited by these terms. These terms are only used to distinguish one element from another. For example, a first inverting Op-amp input could be termed a second inverting Op-amp input, and, similarly, a second inverting Op-amp input could be termed the first inverting Op-amp input, without changing the meaning of the description, so long as all occurrences of the "first inverting Op-amp input" are renamed consistently and all occurrences of the "second inverting Op-amp input" are renamed consistently. The first inverting Op-amp input and the second inverting Op-amp input are columns both inverting Op-amp inputs, but they are not the same inverting Op-amp input.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising:
a first Op-amp comprising a first inverting Op-amp input, a first non-inverting Op-amp input, and a first Op-amp output; a row switch device comprising a row switch input and a row switch output; and a crossbar array comprising a row wire, a column wire, and a cross-point device connected between the row wire and the column wire, wherein the row switch input is connected to the first Op-amp output, the row switch output is connected to the first inverting Op-amp input, and the row switch output is connected to the row wire.

2. The apparatus as claimed in claim 1, further comprises: a Digital to Analog Converter (DAC) connected to the row switch, wherein the DAC comprises the first Op-amp; a column switch device connected to the column wire; a Trans-Impedance Amplifier (TIA) connected to the column switch device; and an Analog to Digital Converter (ADC) connected to the TIA.

3. The apparatus as claimed in claim 1, wherein the cross-point device may be one of: a memristor, a memristive device, a Pulse-Code Modulation (PCM) device, a floating gate device, a phase change device, a Resistive Random-Access Memory (RRAIVI or ReRAM), a Magnetoresistive Random-Access Memory (MRAM), a Dynamic random-access memory (DRAM), a Static Random-Access Memory (static RAM or SRAM), or other devices with tunable resistance.

4. The apparatus as claimed in claim 1, wherein the cross-point device may be 1-Transistor-1-Resistor (1TIR), 1-Selector-1-Resistor (1 S IR), or 2-Resistor (2R) structure.

5. The apparatus as claimed in claim 1, wherein the row switch comprises a CMOS switch circuit.

* * * * *